United States Patent
Varadarajan et al.

(10) Patent No.: US 9,828,672 B2
(45) Date of Patent: Nov. 28, 2017

(54) MINIMIZING RADICAL RECOMBINATION USING ALD SILICON OXIDE SURFACE COATING WITH INTERMITTENT RESTORATION PLASMA

(71) Applicant: Lam Research Corporation, Fremont, CA (US)

(72) Inventors: Bhadri N. Varadarajan, Beaverton, OR (US); Bo Gong, Sherwood, OR (US); Rachel E. Batzer, Tualatin, OR (US); Huatan Qiu, Lake Oswego, OR (US); Bart J. van Schravendijk, Palo Alto, CA (US); Geoffrey Hohn, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 39 days.

(21) Appl. No.: 14/712,167

(22) Filed: May 14, 2015

(65) Prior Publication Data

US 2016/0281230 A1 Sep. 29, 2016

Related U.S. Application Data

(60) Provisional application No. 62/138,810, filed on Mar. 26, 2015.

(51) Int. Cl.
*C23C 16/40* (2006.01)
*B05D 3/14* (2006.01)
(Continued)

(52) U.S. Cl.
CPC ...... *C23C 16/45525* (2013.01); *C23C 16/402* (2013.01); *C23C 16/4404* (2013.01);
(Continued)

(58) Field of Classification Search
CPC ..... C23C 16/40; C23C 16/401; C23C 16/402; C23C 16/45536; C23C 16/45544; H05H 1/00; B05D 3/14
See application file for complete search history.

(56) References Cited

U.S. PATENT DOCUMENTS

| | | | |
|---|---|---|---|
| 4,892,753 A | 1/1990 | Wang et al. | |
| 5,605,859 A | 2/1997 | Lee | |

(Continued)

FOREIGN PATENT DOCUMENTS

CN 103243310 A 8/2013

OTHER PUBLICATIONS

Kang, S.C., et al., "Evaluation of silicon oxide cleaning using F2/Ar remote plasma processing." J. Vac. Sci. Technol. A 23(4), Jul./Aug. 2005, pp. 911-916.*

(Continued)

*Primary Examiner* — Bret Chen
(74) *Attorney, Agent, or Firm* — Weaver Austin Villeneuve & Sampson LLP

(57) ABSTRACT

Methods and apparatus for remote plasma processing are provided. In various embodiments, a reaction chamber is conditioned by forming a low recombination material coating on interior chamber surfaces. The low recombination material helps minimize the degree of radical recombination that occurs within the reaction chamber when the reaction chamber is used to process substrates. During processing on substrates, the low recombination material may become covered by relatively higher recombination material (e.g., as a byproduct of the substrate processing), which results in a decrease in the amount of radicals available to process the substrate over time. The low recombination material coating may be reconditioned through exposure to an oxidizing plasma, which acts to reform the low recombination material (Continued)

coating. The reconditioning process may occur periodically as additional processing occurs on substrates.

19 Claims, 3 Drawing Sheets

(51) Int. Cl.
- *C23C 16/455* (2006.01)
- *C23C 16/50* (2006.01)
- *H01J 37/32* (2006.01)
- *C23C 16/44* (2006.01)
- *C23C 16/452* (2006.01)
- *C23C 16/458* (2006.01)

(52) U.S. Cl.
CPC ........ *C23C 16/452* (2013.01); *C23C 16/4581* (2013.01); *C23C 16/45565* (2013.01); *C23C 16/50* (2013.01); *H01J 37/32357* (2013.01); *H01J 37/32486* (2013.01)

(56) References Cited

U.S. PATENT DOCUMENTS

| | | | |
|---|---|---|---|
| 5,647,953 A * | 7/1997 | Williams | B08B 7/0035 134/1.1 |
| 5,654,475 A | 8/1997 | Vassiliou et al. | |
| 5,824,375 A * | 10/1998 | Gupta | B08B 7/0035 134/1.1 |
| 5,970,383 A | 10/1999 | Lee | |
| 6,071,573 A | 6/2000 | Koemtzopoulos et al. | |
| 6,121,161 A | 9/2000 | Rossman et al. | |
| 6,121,164 A | 9/2000 | Yieh et al. | |
| 6,416,577 B1 | 7/2002 | Suntoloa et al. | |
| 6,449,521 B1 * | 9/2002 | Gupta | B08B 7/0035 118/715 |
| 6,626,188 B2 | 9/2003 | Fitzsimmons et al. | |
| 6,749,098 B2 | 6/2004 | Roier et al. | |
| 6,815,007 B1 | 11/2004 | Yoo et al. | |
| 6,819,969 B2 | 11/2004 | Lee et al. | |
| 7,118,779 B2 | 10/2006 | Verghese et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 * | 10/2007 | Li | C23C 16/4405 427/237 |
| 7,601,639 B2 | 10/2009 | Pavone et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,101,531 B1 | 1/2012 | Li et al. | |
| 8,163,087 B2 | 4/2012 | Faguet et al. | |
| 8,293,658 B2 | 10/2012 | Shero et al. | |
| 9,228,259 B2 | 1/2016 | Haukka et al. | |
| 9,328,416 B2 | 5/2016 | Dhas et al. | |
| 9,745,658 B2 | 8/2017 | Kang et al. | |
| 2001/0006835 A1 | 7/2001 | Kim et al. | |
| 2002/0073922 A1 | 6/2002 | Frankel et al. | |
| 2003/0013314 A1 | 1/2003 | Ying et al. | |
| 2004/0023516 A1 | 2/2004 | Londergan et al. | |
| 2004/0134427 A1 | 7/2004 | Derderian et al. | |
| 2005/0130427 A1 | 6/2005 | Won et al. | |
| 2005/0214455 A1 | 9/2005 | Li et al. | |
| 2005/0221020 A1 | 10/2005 | Fukiage | |
| 2006/0046470 A1 * | 3/2006 | Becknell | G03F 7/427 438/637 |
| 2006/0093756 A1 | 5/2006 | Rajagopalan et al. | |
| 2006/0189171 A1 * | 8/2006 | Chua | C23C 16/4404 438/800 |
| 2006/0280868 A1 | 12/2006 | Kato et al. | |
| 2007/0201016 A1 * | 8/2007 | Song | G01N 21/68 356/72 |
| 2008/0094775 A1 | 4/2008 | Sneh et al. | |
| 2008/0118663 A1 * | 5/2008 | Choi | C23C 16/4404 427/579 |
| 2008/0302281 A1 | 12/2008 | Bernard et al. | |
| 2009/0197401 A1 * | 8/2009 | Li | C23C 14/48 438/513 |
| 2009/0242511 A1 | 10/2009 | Shimazu et al. | |
| 2009/0278116 A1 | 11/2009 | Yamate | |
| 2009/0325391 A1 | 12/2009 | De Vusser et al. | |
| 2011/0070380 A1 | 3/2011 | Shero et al. | |
| 2011/0151142 A1 | 6/2011 | Seamons et al. | |
| 2011/0256726 A1 | 10/2011 | LaVoie et al. | |
| 2011/0315186 A1 | 12/2011 | Gee et al. | |
| 2012/0097330 A1 | 4/2012 | Iyengar et al. | |
| 2013/0064973 A1 | 3/2013 | Chen et al. | |
| 2013/0089988 A1 * | 4/2013 | Wang | H01J 37/32357 438/719 |
| 2014/0120738 A1 * | 5/2014 | Jung | H01L 21/02219 438/778 |
| 2014/0295670 A1 | 10/2014 | Shih et al. | |
| 2015/0147482 A1 | 5/2015 | Kang et al. | |
| 2015/0203967 A1 | 7/2015 | Dhas et al. | |
| 2016/0281230 A1 | 9/2016 | Varadarajan et al. | |
| 2016/0300713 A1 | 10/2016 | Cui et al. | |

OTHER PUBLICATIONS

Cunge, G., et al., "Plasma-wall interactions during silicon etching processes in high-density HBr/Cl2/O2 plasma". Plasma Sources Sci. Technol. 14 (2005) S42-S52.*

Cunge, G., et al., "New chamber walls conditioning and cleaning strategies to improve the stability of plasma processes". Plasma Sources Sci. Technol. 14 (2005) 509-609.*

US Office Action dated Dec. 10, 2015 issued in U.S. Appl. No. 14/089,653.

US Office Action dated May 13, 2016 issued in U.S. Appl. No. 14/089,653.

US Office Action, dated Aug. 17, 2015, issued in U.S. Appl. No. 14/158,536.

US Notice of Allowance, dated Jan. 11, 2016, issued in U.S. Appl. No. 14/158,536.

Juárez, H., et al., (2009) "Low temperature deposition: properties of $SiO_2$ films from TEOS and ozone by APCVD system," XIX Latin American Symposium on Solid State Physics (SLAFES XIX). *Journal of Physics: Conference Series* 167(012020) pp. 1-6.

Kim et al. (2015) "Investigation of Plasma Enhanced Chemical Vapor Deposition Chamber Mismatching by Photoluminescence and Raman Spectroscopy," *ECS Journal of Solid State Science and Technology*, 4(8)p. 314-p. 318.

Klimecky et al. (May/Jun. 2003) "Compensation for transient chamber wall condition using real-time plasma density feedback control in an inductively coupled plasma etcher," *Journal Vac. Sci. Technol. A*, 21(3):706-717.

Nakagawa, Takahide (May 1991) "Effect of Coating on the Plasma Chamber Wall in RIKEN Electron Cyclotron Resonance Ion Source," *Japanese Journal of Applied Physics*, 30(5B)L930-L932.

U.S. Appl. No. 14/089,653, filed Nov. 25, 2013, entitled "Chamber Undercoat Preparation Method for Low Temperature ALD Films."

U.S. Appl. No. 14/158,536, filed Jan. 17, 2014, entitled "Method and Apparatus for the Reduction of Defectivity in Vapor Deposited Films."

Kim et al. (1991) "Recombination of O, N, and H Atoms on Silica: Kinetics and Mechanism," *Langmuir*, 7(12):2999-3005.

Knoops et al. (2010) "Conformality of Plasma-Assisted ALD: Physical Processes and Modeling," *Journal of the Electrochemical Society*, 157(12):G241-G249.

US Final Office Action dated Oct. 28, 2016 issued in U.S. Appl. No. 14/089,653.

US Notice of Allowance dated Jan. 23, 2017 issued in U.S. Appl. No. 14/089,653.

(56) References Cited

OTHER PUBLICATIONS

Chinese First Office Action, dated Sep. 5, 2016, issued in Application No. CN 201410686823.4.
U.S. Appl. No. 15/384,175, filed Dec. 19, 2016, Deqi Wang, et al.

* cited by examiner

MINIMIZING RADICAL RECOMBINATION USING ALD SILICON OXIDE SURFACE COATING WITH INTERMITTENT RESTORATION PLASMA

CROSS REFERENCE TO RELATED APPLICATION

This application claims benefit of U.S. Provisional Patent Application Ser. No. 62/138,810, filed Mar. 26, 2015, and titled "MINIMIZING RADICAL RECOMBINATION," which is herein incorporated by reference in its entirety.

BACKGROUND

Semiconductor processing typically takes place in specialized semiconductor processing apparatus. The apparatus often includes a reaction chamber that houses a substrate during processing. The reaction chamber also typically includes various pieces of hardware (e.g., a substrate support, showerhead, etc.) for accomplishing the semiconductor fabrication processes. In some cases, the reaction chamber may be treated before it is used for processing substrates. The reaction chamber treatment may take a number of different forms, and may be performed for a variety of reasons.

SUMMARY

Certain embodiments herein relate to methods of conditioning a reaction chamber. Certain other embodiments herein relate to apparatus configured to condition a reaction chamber. The reaction chamber may be used for processing substrates using remote plasma processing. In various embodiments, conditioning the reaction chamber involves coating interior chamber surfaces with a material that promotes a low degree of radical recombination. The chamber may also be reconditioned periodically to reform the low recombination material.

In one aspect of the embodiments herein, a method is provided for conditioning a reaction chamber used to perform remote plasma processing, the method including: forming a low recombination material coating on exposed surfaces within the reaction chamber through an atomic layer deposition process while no substrate is present in the reaction chamber; and after performing a remote plasma operation on one or more substrates, exposing the reaction chamber to an oxidizing plasma to recondition the exposed surfaces within the reaction chamber and thereby reform the low recombination material coating.

The method may further include after forming the low recombination material coating, performing the remote plasma operation to process one or more substrates in the reaction chamber, where the remote plasma operation results in formation of a second coating on at least a portion of the exposed surfaces within the reaction chamber, the second coating promoting a higher rate of radical recombination during the remote plasma operation than the low recombination material coating. In various cases, exposing the reaction chamber to the oxidizing plasma modifies the second coating to reform the low recombination material coating.

In some embodiments, the reaction chamber is exposed to the oxidizing plasma for a duration between about 0.05-5 seconds. In some such cases, the duration may be between about 0.1-1 seconds.

The atomic layer deposition process for forming the low recombination material coating on exposed surfaces within the reaction chamber may include: (a) flowing a first reactant into the reaction chamber and allowing the first reactant to adsorb onto exposed surfaces within the reaction chamber; (b) purging the first reactant from the reaction chamber; (c) flowing a second reactant into the reaction chamber; (d) exposing the exposed surfaces within the reaction chamber to plasma to drive a surface reaction between the first reactant and the second reactant to form a low recombination material coating on the exposed surfaces within the reaction chamber; and (e) repeating (a)-(d) until the low recombination material coating reaches a final coating thickness. The final thickness of the low recombination material coating may be at least about 50 Å, as measured by an average thickness of the low recombination material coating on a substrate support within the reaction chamber.

In various embodiments, the low recombination material coating includes silicon oxide. In some such embodiments, performing the remote plasma operation includes depositing a silicon-containing film on the one or more substrates, and the second coating includes a silicon-containing material.

Plasma may be generated in a number of different ways. In some embodiments, at least one of the first and second reactants flow into the reaction chamber from a remote plasma chamber, the remote plasma chamber being located proximate the reaction chamber and separated from the reaction chamber by a showerhead. For instance, both the first and second reactants may flow into the reaction chamber from the remote plasma chamber, and the oxidizing plasma may be generated in the remote plasma chamber and flow into the reaction chamber through the showerhead. In some other embodiments, the oxidizing plasma is generated in situ in the reaction chamber.

The remote plasma operation may include a number of steps. For instance, performing the remote plasma operation may include: providing one of the one or more substrates in the reaction chamber, flowing a silicon-containing reactant into the reaction chamber without exposing the silicon-containing reactant to an in situ plasma, generating a hydrogen plasma in a remote plasma chamber, the remote plasma chamber being positioned proximate the reaction chamber and separated from the reaction chamber by a showerhead, and allowing the hydrogen plasma to pass through the showerhead into the reaction chamber while the silicon-containing reactant is flowed into the reaction chamber; and exposing the substrate to the silicon-containing reactant and the hydrogen plasma concurrently to deposit a silicon-containing film on the substrate.

The reaction chamber may or may not contain a substrate when the chamber is exposed to the oxidizing plasma. In some embodiments, one or more substrates are present in the reaction chamber when the reaction chamber is exposed to the oxidizing plasma. In other embodiments, the substrate is removed before exposing the chamber to the oxidizing plasma.

In some embodiments, the method may further include: after exposing the reaction chamber to the oxidizing plasma while the substrate is in the reaction chamber, performing a second remote plasma operation to further process the substrate in the reaction chamber, the second remote plasma operation again resulting in formation of the second coating; and after performing the second remote plasma operation, exposing the reaction chamber to a second oxidizing plasma while the substrate is present in the reaction chamber to again recondition the exposed surfaces within the reaction chamber to modify the second coating to reform the low recombination material coating.

The method may be performed in a cyclic manner in some cases. For instance, the method may include cyclically repeating the steps of (a) performing a remote plasma operation on one or more substrates and (b) exposing the reaction chamber to the oxidizing plasma to recondition the exposed surfaces within the reaction chamber, where between about 1-50 substrates are processed in (a) between each iteration of step (b).

After a batch of substrates is processed, the reaction chamber may be cleaned to remove any low recombination material coating and second coating present on the exposed surfaces within the reaction chamber, the cleaning including exposing the reaction chamber to a fluorine-containing plasma. After cleaning, the method may be repeated.

In another aspect of the disclosed embodiments, a remote plasma processing apparatus for processing a substrate is provided, the apparatus including: a reaction chamber including interior chamber surfaces, a substrate support for supporting the substrate within the reaction chamber, and an exhaust port for removing material from the reaction chamber; a remote plasma chamber including a plasma generator for generating plasma within the remote plasma chamber, an inlet for delivering gas to the remote plasma chamber, an outlet for providing plasma generated in the remote plasma chamber to the reaction chamber; and a controller having instructions for forming a low recombination material coating on interior chamber surfaces of the reaction chamber through an atomic layer deposition process while no substrate is present in the reaction chamber, and after performing a remote plasma operation on the substrate, exposing the reaction chamber to an oxidizing plasma to recondition the interior chamber surfaces and thereby reform the low recombination material coating.

The controller may further have instructions for after forming the low recombination material coating, providing the substrate in the reaction chamber, generating plasma in the remote plasma chamber, and providing the plasma to the reaction chamber to perform a remote plasma operation, where the remote plasma operation results in formation of a second coating on at least a portion of the interior chamber surfaces, the second coating promoting a higher rate of radical recombination during the remote plasma operation than the low recombination material coating, and where exposing the reaction chamber to the oxidizing plasma modifies the second coating to reform the low recombination material coating.

In various embodiments, the outlet of the remote plasma chamber is a showerhead that separates the remote plasma chamber from the reaction chamber.

The instructions for exposing the reaction chamber to an oxidizing plasma may include instructions to expose the reaction chamber to the oxidizing plasma for a duration between about 0.05-5 seconds. The instructions for forming the low recombination material coating on interior chamber surfaces of the reaction chamber through an atomic layer deposition process may in some embodiments include instructions for: (a) flowing a first reactant into the reaction chamber and allowing the first reactant to adsorb onto exposed surfaces within the reaction chamber; (b) purging the first reactant from the reaction chamber; (c) flowing a second reactant into the reaction chamber; (d) exposing the exposed surfaces within the reaction chamber to plasma to drive a surface reaction between the first reactant and the second reactant to form a low recombination material coating on the exposed surfaces within the reaction chamber; and (e) repeating (a)-(d) until the low recombination material coating reaches a final coating thickness. In various embodiments, the final coating thickness is at least about 50 Å as measured based on the average thickness deposited on the substrate support.

These and other features will be described below with reference to the associated drawings.

DETAILED DESCRIPTION

Figure 1:
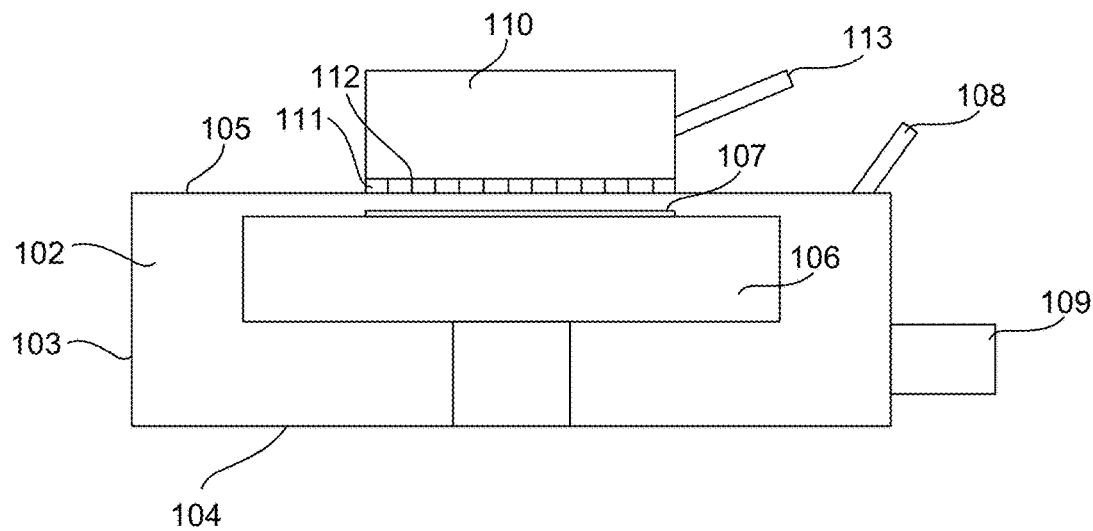
FIG. 1 illustrates a simplified view of a reaction chamber for processing a substrate using a remote plasma.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. The chambers described herein may be used to process work pieces that may be of various shapes, sizes, and materials. In addition to semiconductor wafers, other work pieces that may be processed in chambers prepared according to certain embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Various semiconductor fabrication processes involve the use of a remote plasma. A remote plasma is a plasma that is generated in one location and delivered to a second location where processing occurs, the second location being separate from the first location. For instance, a remote plasma may be generated in a plasma source that is connected with a reaction chamber, the plasma being delivered from the plasma source to the reaction chamber during processing.

One reason that remote plasmas are desirable in some processes is that they can provide a relatively high concentration of radicals and a relatively low concentration of ions, compared to plasmas that are generated directly in a processing chamber. Thus, it is particularly useful to use a remote plasma when it is desired that processing occurs by way of radicals.

Disclosed herein are methods of conditioning a reaction chamber that is used for a remote plasma processing as well as apparatus used for remote plasma processing. Examples of radical-based processes include deposition processes, etching processes, and treating processes. In a particular example, a radical-based process is a hydrogen-radical-based process for depositing a silicon-containing film such as silicon carbide, silicon nitrocarbide, or silicon oxycarbide and combinations thereof (silicon oxy carbo nitride for example). In some embodiments, the deposition process is a hydrogen radical-based deposition process, described further below.

One problem that is encountered with various remote plasma processes is radical recombination. If radicals recombine before reaching the substrate, such radicals are no longer available for processing on the substrate. Certain radicals experience this problem to a greater degree than other radicals. For example, hydrogen radicals have very high recombination rates on most materials. The result is that when processing a substrate using remotely generated hydrogen radicals, such radicals often recombine on surfaces between the plasma source and the reaction chamber and/or on surfaces of the reaction chamber, which leaves these radicals incapable of performing any useful processing in the gas phase or on the substrate.

Radical recombination is especially problematic immediately following a chamber clean. In various implementations, semiconductor substrates are processed serially within a batch. One batch includes a group of substrates that are processed in the same reaction chamber between sequential chamber cleaning operations. In one example, a reaction chamber is cleaned, then 100 substrates are processed in the reaction chamber (e.g., individually, or more than one at a time if the apparatus is equipped with multiple stations to process more than one substrate in the reaction chamber at a time), then the reaction chamber is cleaned again. The 100 substrates are a single batch. In some embodiments herein, a batch includes between about 100-3000 substrates. The batch size depends at least in part on the thickness of film deposited on each substrate. It is primarily limited by increasing non-uniformity of the deposited film with increasing accumulation on chamber surfaces, or increase in defects (particles) with increasing accumulation. The optimal batch size is also affected by the film being deposited, and how much of the film material deposits on the chamber walls vs. on the substrate. Since the chamber is colder than the pedestal in many cases, a film that deposits relatively more at low temperatures would grow very quickly on these surfaces, eventually causing particle problems. Conversely, for films that deposit at relatively lower rates at lower temperatures, one could easily run a lot more wafers before particle issues become problematic.

The chamber may be cleaned with fluorine-based chemistry in some embodiments (leaving bare chamber walls, e.g., bare aluminum walls). After the chamber is cleaned, the number of radicals that survive to reach the substrate is extremely low, and the substrate is not able to be processed as desired.

Low Radical Recombination Surface Coating

Implementations of the methods disclosed herein involve coating the relevant surfaces of a chamber with a material that exhibits a low recombination rate for the relevant radicals. For instance, in certain embodiments the radicals used for processing substrates in the chamber have a recombination probability that is about 5E-4 or less (for example 1E-4 or less) on the material coated on chamber surfaces. For instance, hydrogen radicals interacting with a silicon oxide coated surface exhibit a recombination probability of about 4E-5.

In the context of hydrogen radicals, one material that promotes a low recombination rate is silicon oxide ($SiO_2$). Silicon oxide may also promote a low radical recombination rate with other radicals. As such, in various embodiments herein, relevant surfaces are coated with silicon oxide to help maintain a low rate of hydrogen radical (or other radical) recombination on the relevant surfaces. The relevant surfaces may include, for example, surfaces within the reaction chamber, surfaces between the reaction chamber and the remote plasma source, and surfaces within the remote plasma source. Surfaces within or proximate the reaction chamber that may be coated include, for example, a substrate support/pedestal, chamber walls/ceiling/floor, showerhead, showerhead holes, inlets, outlets, etc. Examples of other materials that may promote a low rate of radical recombination in certain embodiments are listed below.

FIG. 1 presents a simplified view of an apparatus that may be used for certain radical-based processes such as a hydrogen radical-based deposition process. Other radical-based processes and reaction chambers may also be used in accordance with certain embodiments. A processing includes chamber walls 103, chamber floor 104, and chamber ceiling 105. Inside the processing chamber 102 is a substrate support 106, on which substrate 107 sits. The processing chamber 102 also includes an inlet 108 and an exhaust outlet 109. A remote plasma source 110 is provided above the processing chamber 102. The remote plasma source 110 includes a plasma generator (not shown) for generating a plasma within the remote plasma source. The plasma generator includes hardware (e.g., coils, electrodes, etc.) for producing a plasma, which may be an inductively coupled plasma, a capacitively coupled plasma, a microwave coupled plasma, etc. The remote plasma source 110 is separated from the processing chamber 102 by a showerhead 111 having a plurality of showerhead holes 112. The remote plasma source 110 has an inlet 113 for providing gas used to generate the remote plasma.

Figure 2:
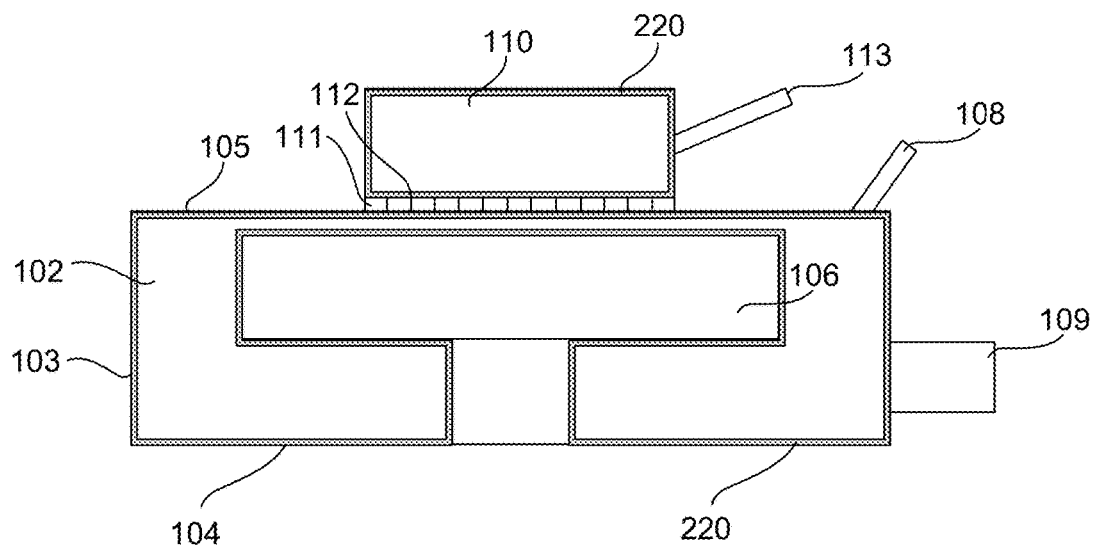
FIG. 2 shows the reaction chamber of FIG. 1 with a low recombination material coating covering the interior surfaces.

FIG. 2 illustrates the apparatus shown in FIG. 1 after it has been coated with a low recombination material coating 220. The substrate 107 is not shown in this figure, and the low recombination material coating 220 is exaggerated in thickness for the purpose of illustration. Further, the low recombination material coating 220 may be present in areas not visible in FIG. 2, such as on interior surfaces of the showerhead holes 112. In some embodiments, the low recombination material coating 220 covers only surfaces that are on the inside of the processing chamber 102. In other embodiments, the low recombination material coating 220 also covers surfaces inside the remote plasma chamber 110, and/or showerhead surfaces, as mentioned above.

Many of the embodiments herein are presented in the context of a silicon oxide low recombination material. Silicon oxide is a very effective material in minimizing recombination of hydrogen radicals. However, materials other than silicon oxide may also be used in certain implementations. The material chosen should be one that promotes a low rate of radical recombination with the particular radicals being used. Further, the material chosen should be one that can conformally form over surfaces of the reaction chamber, for example using atomic layer deposition (ALD) methods as described herein. In various cases the low recombination material is an oxide. Examples of materials other than silicon oxide that may be useful as a low recombination material include, but are not limited to, zirconium oxide, aluminum oxide, hafnium oxide, yttrium oxide, yttria-stabilized zirconia (YSZ), and combinations thereof.

Formation of the Low Recombination Material Coating

The low recombination material coating may be formed in a manner that results in deposition of the low recombination material on all the surfaces on which deposition is desired. One method which is particularly suited to this goal is atomic layer deposition (ALD). ALD methods are cyclic processes that deposit very uniform/conformal films over exposed surfaces.

Figure 3:
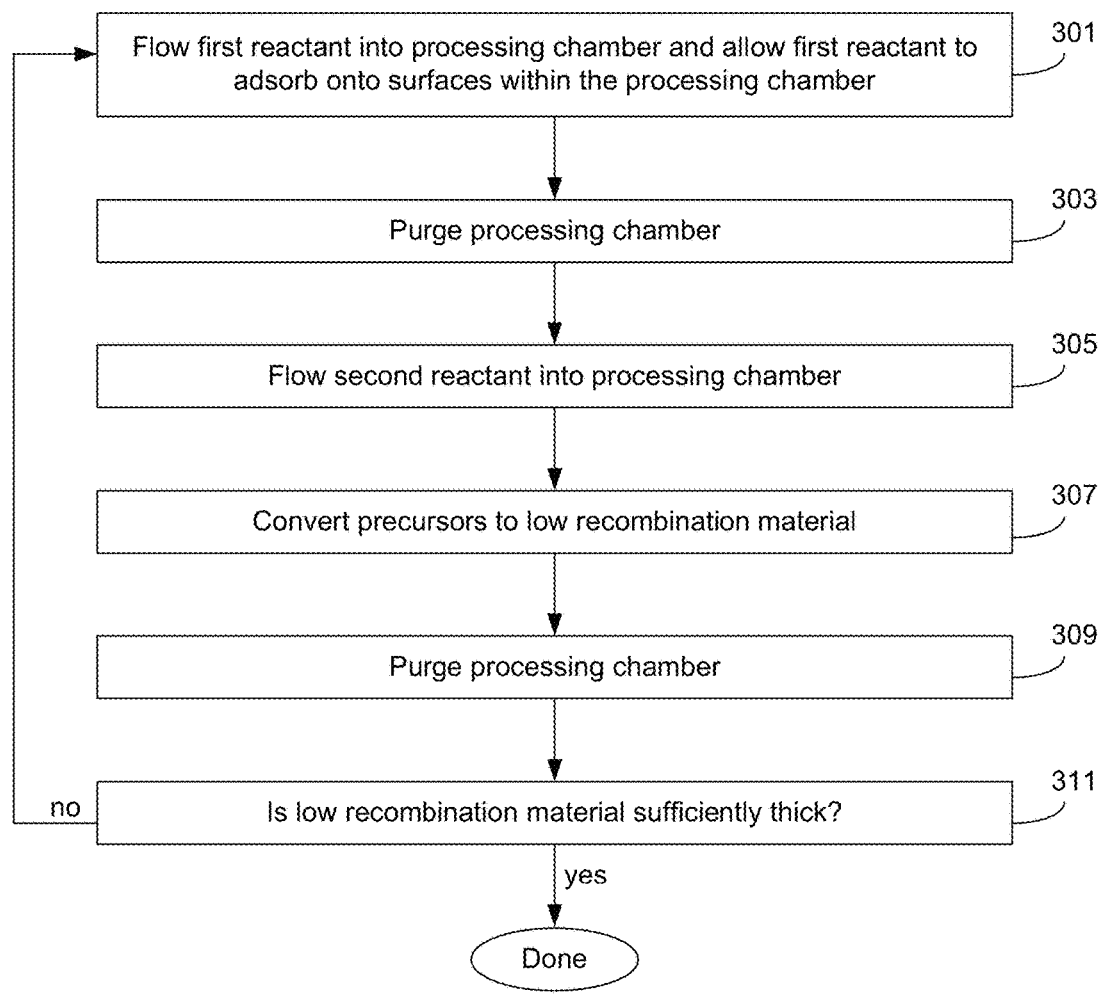
FIG. 3 is a flow chart describing a method of forming a low recombination material coating on interior chamber surfaces using an atomic layer deposition (ALD)-type reaction.

FIG. 3 presents a flow chart for a method of forming a low recombination material coating on surfaces of a reaction chamber. The method is presented in the context of the apparatus shown in FIGS. 1 and 2. The method begins at operation 301, where a first reactant is flowed into the processing chamber 102. The first reactant may flow in through the inlet 108 to the processing chamber 102, or through the inlet 113 to the remote plasma chamber 110. Flowing the reactants through the inlet 113 to the remote plasma chamber 110 promotes formation of the low combination material 220 on surfaces within the remote plasma chamber 110, and on the interior surfaces of the showerhead holes 112. In certain cases where the first reactant is flowed into the processing chamber 102 via the inlet 108, no gas flows through the remote plasma source 110 while the first reactant is delivered. Regardless of where the first reactant is delivered, the first reactant is delivered in gas form, without plasma present. The first reactant adsorbs onto the surfaces of the processing chamber 102 such as the chamber walls 103, chamber floor 104, chamber ceiling 105, and substrate support 106. Additional surfaces onto which the first reactant adsorbs may include surfaces of the showerhead 111, and surfaces within the remote plasma chamber 110. Adsorption and saturation of the first precursor may be promoted by closing exhaust valves (not shown) and allowing the pressure within the processing chamber to rise slightly with delivery of the first reactant.

Where the low recombination material 220 is silicon oxide, the first reactant is typically a silicon-containing reactant. In some cases the silicon-containing reactant is a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethyl silane, isopropylsilane, t-butylsilane, dimethylsilane, diethyl silane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethyl silane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. Further examples of an aminosilane include trisilylamine ($N(SiH_3)_3$), dimethyl amino dimethyl silane, bis(dimethylamino) dimethyl silane, bis(dimethylamino) methyl silane, dimethylamino trimethyl silane, tris(dimethylamino) silane, and bis(diethylamino) silane. Combinations of these reactants may also be used in some cases.

Where the low recombination material is a metal oxide, the first reactant may be, in some cases, a metal alkylamine, metal alkoxide, metal alkylamide, metal halide, metal β-diketonate, metal carbonyl, organometallic, etc. Appropriate metal-containing precursors will include the metal that is desired to be incorporated into the film. For instance, if the low recombination material is aluminum oxide, the first reactant may include, among others, aluminum tris(2,2,6,6-tetramethyl-3,5-heptanedionate) ($Al(OCC(CH_3)_3CHCOC(CH_3)_3)_3$), triisobutylaluminum ($[(CH_3)_2CHCH_2]_3Al$), trimethylaluminum ($(CH_3)_3Al$), tris(dimethylamido)aluminum ($Al(N(CH_3)_2)_3$), and combinations thereof.

Where the low recombination material is hafnium oxide, the first reactant is typically a hafnium-containing reactant. Examples of hafnium-containing reactants include, among others, bis(tert-butylcyclopentadienyl)dimethylhafnium ($C_{20}H_{32}Hf$), bis(methyl-$\eta^5$-cyclopentadienyl)dimethylhafnium ($Hf[C_5H_4(CH_3)]_2(CH_3)_2$), bis(methyl-$\eta^5$-cyclopentadienyl)methoxymethylhafnium ($HfCH_3(OCH_3)[C_5H_4(CH_3)]_2$), bis(trimethylsilyl)amidohafnium chloride ($[[(CH_3)_3Si]_2N]_2HfCl_2$), dimethylbis(cyclopentadienyl)hafnium ($(C_5H_5)_2Hf(CH_3)_2$), hafnium tert-butoxide ($Hf[OC(CH_3)_3]_4$), hafnium isopropoxide isopropanol ($C_{12}H_{28}HfO_4$), tetrakis(diethylamido)hafnium ($[(CH_2CH_3)_2N]_4Hf$), tetrakis(dimethylamido)hafnium ($[(CH_3)_2N]_4Hf$), tetrakis(ethylmethylamido)hafnium ($[(CH_3)(C_2H_5)N]_4Hf$), and combinations thereof.

Where the low recombination material is zirconium oxide, the first reactant is typically a zirconium-containing reactant. Examples of zirconium-containing reactants include, but are not limited to, bis(cyclopentadienyl)zirconium dihydride ($C_{10}H_{12}Zr$), bis(methyl-$\eta^5$-cyclopentadienyl)methoxymethylzirconium ($Zr(CH_3C_5H_4)_2CH_3OCH_3$), dimethylbis(pentamethylcyclopentadienyl)zirconium ($C_{22}H_{36}Zr$), tetrakis(diethylamido)zirconium ($[(C_2H_5)_2N]_4Zr$), tetrakis(dimethylamido)zirconium ($[(CH_3)_2N]_4Zr$), tetrakis(ethylmethylamido)zirconium ($Zr(NCH_3C_2H_5)_4$), zirconium dibutoxide(bis-2,4-pentanedionate) ($C_{18}H_{32}O_6Zr$), zirconium 2-ethylhexanoate ($Zr(C_8H_{15}O_2)_4$), zirconium tetrakis(2,2,6,6-tetramethyl-3,5-heptanedionate) ($Zr(OCC(CH_3)_3CHCOC(CH_3)_3)_4$), and combinations thereof. Other metal oxides may also be formed, and may use other reactants.

In some embodiments, the first reactant is not a halogen-containing reactant. Non-halogen-containing reactants may be beneficial in some embodiments to avoid unwanted interactions with certain chamber surfaces (e.g., aluminum surfaces). In some such embodiments, the first reactant may include an amine group. In these or other cases, the first reactant may include an alkoxy group.

The reaction chamber is typically maintained at a relatively high pressure during delivery of the first reactant. The high pressure helps ensure that the first reactant adsorbs onto all the relevant surfaces. The higher the partial pressure of the chemistry, the shorter time it takes for the saturating reaction to take place. In some embodiments, the pressure in the reaction chamber may be between about 0.1-20 Torr, for example between about 0.5-4 Torr. The optimal pressure is primarily affected by amount of precursor flow possible, time, and the chamber volume. The chamber surfaces may be maintained at a temperature between about 20-600° C., for example between about 50-450° C. in some cases. In some embodiments, the first reactant may be flowed into the reaction chamber at a rate between about 1-1000 sccm, or between about 1-25 sccm, for a duration between about 0.1 s-5 min, or between about 10 s-3 min. The optimal duration for the first reactant flow is affected by the flow rate and partial pressure of the precursor and by the size of the chamber.

Next, at operation 303, the processing chamber 102 is purged. The purge may occur by sweeping the processing chamber 102 with a purge gas (e.g., an inert gas), evacuating the processing chamber 102 using vacuum, or by a combination of these options. The purge acts to remove any non-adsorbed molecules of the first reactant from the processing chamber 102.

After purging the processing chamber 102, a second reactant is flowed into the processing chamber 102 at operation 305. As with the first reactant, the second reactant may be flowed in through the inlet 108 to the processing chamber 102 or through the inlet 113 to the remote plasma chamber 110. Flowing the second reactant through the inlet 113 in the remote plasma chamber 110 will help form the low recombination material on surfaces within the remote plasma chamber 110, as well as on surfaces of the showerhead 111. Either or both of the first and second reactants may be flowed in with a carrier gas, e.g., an inert gas.

Oftentimes, the second reactant is an oxygen-containing reactant. Examples of oxygen-containing reactants include, but are not limited to, oxygen ($O_2$), carbon dioxide ($CO_2$), nitrous oxide ($N_2O$), water ($H_2O$), ozone, and combinations thereof. In a particular example, the second reactant is oxygen. In some embodiments, the second reactant flows at a rate between about 100-20,000 sccm, or between about 500-5000 sccm, for a duration between about 0.25-60 s, or between about 1-20 s. The second reactant may be delivered along with an inert carrier gas (e.g., helium, argon, etc.), which may also help establish and sustain the plasma and increase the breakdown efficiency.

At operation 307, energy is supplied to convert the precursors to the low recombination material coating 220 using a surface reaction. The low recombination material 220 forms on various surfaces as shown in FIG. 2, for instance. The energy may be thermal energy or plasma energy in many embodiments. Where thermal energy is used to drive the reaction, the chamber surfaces may be brought to an elevated temperature to promote formation of the low recombination material. Further, where thermal energy is used, the reactants used to form the low recombination material may be chosen to be particularly reactive (e.g., ozone, water, etc.). Where plasma energy is used, relatively less reactive reactants may be used in some cases.

The plasma may be generated in the processing chamber 102 or in the remote plasma chamber 110. Where plasma is generated in the remote plasma chamber 110, radicals diffuse out into the processing chamber 102, as occurs during processing on substrates. The plasma may be an inductively coupled plasma, a capacitively coupled plasma, a microwave coupled plasma, etc. In some embodiments, an RF power used to generate the plasma may be between about 200-4500 W per station, or between about 1500-3000 W per station. The optimal power depends on the source used to generate the plasma. ICP sources typically use relatively higher power, and CCP sources typically use relatively lower power. The frequency used to generate the plasma may be an HF frequency in some embodiments. Example HF frequencies range between about 1.8 MHz and about 2.45 GHz. Particular example frequencies that may be used in some embodiments include 13.56 MHz, 27 MHz, 40 MHz, 60 MHz, 100 MHz, and/or 2.45 GHz. The plasma may be present for a duration between about 0.25-60 s, or between about 1-20 s.

In some embodiments, operation 307 (sometimes referred to as the conversion operation) occurs after the flow of the second reactant has ceased. The processing chamber 102 may be optionally purged between operations 305 and 307, for example using a sweep gas and/or by evacuating the processing chamber 102. In other embodiments, operations 305 and 307 may overlap. For instance, in some cases the conversion operation 307 begins while the second reactant is still flowing into the processing chamber 102 (i.e., operation 307 starts while operation 305 is ongoing). In other cases the conversion operation 307 and the delivery of the second reactant in operation 305 begin at substantially the same time. The flow of the second reactant in operation 305 may cease before, during, or at the end of the conversion operation 307.

Next, the processing chamber 102 is purged to remove any non-adsorbed species at operation 309. This operation 309 is sometimes referred to as the post-plasma purge. Operations 301-309 together represent a single cycle of the ALD reaction. Each cycle may deposit about a monolayer of material, which may be on the order of about 0.5-3 Å thick, although sub-monolayers or layers thicker than a monolayer may be deposited in some embodiments. At the end of each ALD cycle, it is determined in operation 311 whether the deposited low recombination material coating 220 is sufficiently thick. If the material is thick enough, the deposition process comes to an end. Otherwise, the process repeats from operation 301 and additional low recombination material is deposited. The determination in operation 311 is often made based on the known/estimated thickness deposited per cycle, the number of cycles, and the desired final thickness.

In some embodiments, the low recombination material coating 220 is deposited to a total thickness between about 50-500 Å, or between about 100-300 Å. Thicker coatings may be used in certain cases. In one particular example the low recombination material 220 is deposited to a thickness of about 200 Å. These thicknesses are based on the average thickness of the film that would be deposited on the substrate support 106 (or a substrate on the substrate support 106, if present) if the substrate support were maintained at temperature of about 400° C. during deposition of the low recombination material. The film may have different thicknesses in other areas, though it is believed that the film thickness is relatively uniform on the various chamber surfaces, at least where the low recombination material is silicon oxide. In these or other embodiments, the total number of ALD cycles for forming the low recombination material coating 220 may be between about 50-1000, or between about 100-300. In a particular example, about 150 cycles are used, resulting in a total thickness of about 200 Å on the substrate support 106.

An alternative method of forming a silicon oxide low recombination material coating 220 can be used. In one example, a hydrogen ($H_2$) plasma can be used to etch a quartz component within the processing chamber. The $SiO_2$ in the quartz is etched from the quartz component and redistributed on surfaces within the processing chamber. While etching quartz and redistributing the $SiO_2$ may be used, ALD processing may be more appropriate for certain chambers. As compared to deposition of the low recombination material with ALD as described in relation to FIG. 3, an in-situ $H_2$ plasma method may take longer and result in less uniform coverage on chamber surfaces. Further, this method ($H_2$ plasma) causes degradation of the quartz component, which may be undesirable, and the silicon oxide formed in this manner may be less able to be successfully reconditioned into a low recombination material after processing occurs in the processing chamber, as described further below.

The low recombination material coating 220 is typically formed before the processing chamber is used to process substrates. In various embodiments, the low recombination material coating 220 is formed after a chamber cleaning operation (e.g., using fluorine-based chemistry or other chamber cleaning techniques), and before processing substrates. In other words, the low recombination material coating 220 may be formed at the beginning of each batch of substrates.

The low recombination material coating 220 can be contrasted with an "undercoat" used on certain semiconductor processing apparatus such as certain reactors for performing chemical vapor deposition (CVD) and/or atomic layer deposition (ALD) on substrates. In various CVD and ALD reactors, an undercoat having a thickness between about 3-4 µm is deposited on interior chamber surfaces (which are often aluminum), much like the low recombination material coating 220 shown in FIG. 2. However, these two coatings have vastly different thicknesses (the undercoat being much thicker than the disclosed low recombination material coating 220), and are provided for different reasons. In CVD and ALD reactors, the undercoat is provided to cover chamber surfaces to prevent the metal chamber surfaces from contaminating the substrate. The in situ plasmas used in such reactors can be very harsh, and can eat away at the metal chamber surfaces if no undercoat is present. The undercoat may also act to provide a more uniform chamber impedance over the course of processing a batch of substrates. By contrast, the low recombination material coating 220 is much thinner than the undercoats used in CVD and ALD reactors, and is provided simply to minimize the amount of radical recombination to maximize the amount of radicals available for processing on the substrate. Without wishing to be bound by theory, the issue of substrate contamination related to bare chamber surfaces is much less problematic where a remote plasma is used, since the remote plasma is less harsh and less likely to eat away at the chamber surfaces to contaminate the substrate. In various embodiments herein, the processing chamber and surfaces therein are coated with a relatively thin layer of low recombination material, and a relatively thick undercoat (as described herein) is not used.

Reconditioning the Low Recombination Material Coating

While the low recombination material coating is very useful in minimizing the degree of radical recombination during processing, certain issues arise during processing of an entire batch of substrates. For example, as additional substrates are processed within a batch, material builds up on the various surfaces that are coated with the low recombination material. The material that builds up may be a material being deposited on substrates (e.g., silicon carbide, silicon nitrocarbide, or silicon oxycarbide in some cases), byproducts of the processing, etc. This material can cover the low recombination material coating to some extent, which significantly reduces the effectiveness of the low recombination material coating. In many cases the material that builds up on chamber surfaces during a batch is a material that promotes a higher rate of radical recombination than the material (e.g., $SiO_2$, or others as described herein) used for the low recombination material coating. As such, radical recombination becomes more problematic as the batch progresses.

The progressively worse radical recombination problem has a substantial impact on film uniformity for a given substrate. More particularly, the center-to-edge film uniformity is compromised. As material deposits on chamber surfaces, the peripheral portion of the substrate is more affected than the center portion of the substrate due to the proximity of the chamber surfaces (which effectively kill nearby radicals as/after the material is deposited) to the peripheral portion of the substrate and the fact that fewer radicals are delivered to this peripheral region to begin with. This film non-uniformity worsens over the course of a batch to a relatively steady state value. Further, the progressively worse radical recombination problem can cause a drift in the rate at which deposition occurs on substrates (with the deposition rate slowing down over the course of a batch).

Certain embodiments of the methods disclosed herein address the material buildup problem by periodically reconditioning the low recombination material coating. This reconditioning alters the built up material to change it to a material that promotes a lower degree of radical recombination. This may involve altering the built up material to form a hydroxylation surface. In a particular example, the built up material is a silicon-containing material (e.g., silicon carbide, silicon nitrocarbide, and/or silicon oxycarbide), and the reconditioning process involves changing the silicon-containing material to silicon oxide.

One method for reconditioning the low recombination material coating is to expose the material to an oxygen-containing plasma. The oxygen-containing plasma effectively burns off/removes the carbon (and other non-silicon/ oxygen elements) from the built up material, and reforms the desired silicon dioxide low recombination material.

In another example embodiment, the processing chamber may be used to form aluminum-containing films, the low recombination material is aluminum oxide, the undesired built up material on chamber surfaces is an aluminum-containing film, and the reconditioning process involves exposing chamber surfaces to an oxygen-containing plasma to convert the built up material back to aluminum oxide. In another embodiment, the processing chamber is used to form hafnium-containing films, the low recombination material is hafnium oxide, the undesired built up material on chamber surfaces is a hafnium-containing film, and the reconditioning process involves exposing chamber surfaces to an oxygen-containing plasma to convert the built up material back to hafnium oxide. Similar implementations using other metals are also contemplated to be within the scope of the present embodiments. In still other embodiments, the low recombination material is silicon oxide, and the reconditioning process involves exposure to an oxygen-containing plasma to promote formation of silicon oxide, regardless of the process occurring on the substrate or the composition of the built up material.

Example gases that may be used to form the oxygen-containing plasma include oxygen ($O_2$), carbon dioxide ($CO_2$), nitrous oxide ($N_2O$), water ($H_2O$), ozone, $H_2+O_2$, and combinations thereof. The gas used to generate the oxygen-containing plasma may also include an inert gas in some embodiments. The oxygen-containing gas may be flowed at a rate between about 100-20,000 sccm, or between about 500-5,000 sccm. The plasma may be generated within the processing chamber or within the remote plasma chamber.

In many cases the processing chamber is exposed to the oxygen-containing plasma for a relatively short time, for example about 5 seconds or less, about 3 seconds or less, or about 1 second or less. In some embodiments, the duration of the oxygen-containing plasma exposure for reconditioning the low recombination material is between about 0.05-3 seconds, or between about 0.1-1 seconds.

Because the duration of plasma exposure is so short, in certain embodiments the reaction chamber is exposed to the plasma while a substrate is still present within the reaction chamber. In one example, a substrate is loaded into a processing chamber having a low recombination material coating of $SiO_2$, and an H-radical based deposition process occurs to deposit about 10-100 Å (e.g., 30 Å) of silicon-containing film on the substrate. The deposition process then stops, and the substrate and chamber are exposed to an oxygen-containing plasma while the substrate is still present in the processing chamber. While the oxygen-containing plasma may have some effect on the film deposited on the substrate, such effect is likely to be small and in many cases is expected to be acceptable. After exposure to the oxygen-containing plasma, an additional 10-100 Å (e.g., 30 Å) of silicon-containing film is deposited on the substrate. The (a) deposition on the substrate and (b) exposure to oxygen-containing plasma may be cycled until the deposited film reaches its final thickness. This embodiment is particularly useful where a film being deposited on substrates is particularly thick (e.g., at least about 60 Å at the final thickness, sometimes between about 60-1500 Å at the final thickness). In some cases, the film thickness deposited on an individual substrate between subsequent reconditioning plasma exposures is between about 20-70 Å, or between about 30-50 Å. The optimal film thickness to deposit between subsequent reconditioning processes depends on how fast the film non-uniformity degrades as a result of the film being deposited.

The frequency of the reconditioning may vary in different implementations. In the preceding example, the low recombination material coating is reconditioned at least once (and in many cases at least twice) per substrate. In another example where the desired final film thickness on the substrate is 1000 Å and 40 Å of film is deposited between subsequent reconditioning processes, the reconditioning process will be performed about 25 times per substrate. The total film thickness and the thickness deposited between reconditioning processes will determine the number of times that the reconditioning should be performed.

In a similar example, the low recombination material coating is reconditioned at least once per substrate, but the substrate is removed from the reaction chamber during exposure to the oxygen-containing plasma. In one implementation, a substrate is loaded into a processing chamber, deposition occurs to a first thickness, the substrate is removed from the processing chamber, the processing chamber is reconditioned as described herein, the substrate is again loaded into the processing chamber, and deposition occurs to deposit film on the substrate to a second thickness. These steps may be repeated until the film on the substrate reaches a final thickness. In another implementation, the low recombination material coating is reconditioned between processing of subsequent substrates (e.g., with a substrate either being present or absent in the processing chamber during reconditioning). In yet another implementation, reconditioning occurs once every n substrates, where n is between about 1-50, or between about 1-10.

The ideal frequency for reconditioning will depend upon various factors including the type of processing occurring on the substrates, the chemistry being used, the composition of the material building up on chamber surfaces, the thickness of film being deposited on each substrate, etc. In order to determine how frequently to recondition the low recombination material coating, one can look to the uniformity of the film thickness deposited on substrates (in embodiments where the substrate processing involves deposition on substrates). As noted above, the material buildup affects the peripheral portions of the substrate more severely than the center portion of the substrate. As such, when the film thickness uniformity (center-to-edge) reaches a certain threshold, the low recombination material coating may be reconditioned.

At the end of a batch of substrates, the processing chamber (and optionally the remote plasma chamber) can be cleaned. The cleaning process may involve the use of fluorine-containing chemistry in some cases (e.g., fluorine-containing plasmas, for example an $NF_3$ based plasma), though other methods may also be used. The cleaning results in removal of all built up material on the relevant surfaces, including the low recombination material. After the chamber is cleaned, a new batch of substrates may be provided. Before the new batch is processed, a fresh low recombination material coating can be provided, for example using the method described in relation to FIG. 3. As the new batch of substrates is processed, the low recombination material coating is periodically reconditioned as described. By providing and reconditioning the low recombination material, the degree of radical recombination is minimized, the amount of radicals surviving to reach the substrate is more uniform over time, and uniformity within the batch of substrates (and within individual substrates) is improved.

In various embodiments, the low recombination material coating is formed through an ALD process. As noted above, one other method available for forming the low recombination material is to use a hydrogen plasma to etch a quartz component within the reaction chamber, the silicon dioxide in the quartz being etched and redeposited on various chamber surfaces. Surprisingly, it has been found that when the silicon oxide low recombination material coating is initially formed in this manner, the oxygen-containing plasma exposure does not successfully recondition the silicon oxide material. Instead, the material remains a relatively high recombination material (at least with respect to hydrogen radicals), even after exposure to the oxygen-containing plasma.

The oxygen-containing plasma reconditioning process should be distinguished from cleaning processes that are commonly used to clean reaction chambers used in plasma processing. In various contexts, plasma reactors may be cleaned using plasma (e.g., an F-based plasma or an O-based plasma in some cases, depending on the type of material to be removed) to remove built-up materials from chamber surfaces. In one example, a reaction chamber used to deposit film through chemical vapor deposition is cleaned using an oxygen-based plasma. The cleaning removes both material that is unintentionally deposited on chamber surfaces (e.g., the film being deposited on substrates and/or byproducts of such deposition) and material that is intentionally deposited on chamber surfaces (e.g., a relatively thick undercoat as described elsewhere herein). After the chamber is cleaned, the chamber surfaces are bare (e.g., aluminum in some cases). By contrast, the oxygen-based plasma reconditioning process merely affects the film on chamber surfaces to convert the exposed film to silicon oxide (or another low recombination material). The film covering the chamber surfaces is modified, not removed.

Processing on Substrates

The embodiments herein are not limited to cases where any particular type of processing is occurring on substrates. In some cases the processing occurring on substrates may be a deposition process. In other cases, the processing occurring on substrates may be an etching process, or a treatment process, for example. In general, the disclosed embodiments are useful in any case where it is desired that processing occurs by way of radicals.

Various implementations discussed herein are presented in the context of a semiconductor processing method that involves depositing a silicon-containing film (e.g., silicon carbide, silicon nitrocarbide, or silicon oxycarbide) on substrates using a remote hydrogen plasma. Certain details of this particular implementation are provided for context, but it is understood that the embodiments are not limited to this type of processing. In some embodiments, the process for depositing the silicon-containing film on substrates is a hydrogen radical-based deposition process. Such processes are further discussed in U.S. patent application Ser. No. 14/616,435, filed Feb. 6, 2015, and titled "CONFORMAL FILM DEPOSITION OF SILICON CARBIDE FILMS", U.S. patent application Ser. No. 13/907,699, filed May 31, 2013, and titled "METHOD TO OBTAIN SIC CLASS OF FILMS OF DESIRED COMPOSITION AND FILM PROPERTIES," which are each herein incorporated by reference in their entireties.

In the context of FIGS. 1 and 2, the process may involve delivery of one or more precursor(s) to a processing chamber 102, for example through inlet 108. The precursor is not directly exposed to an active plasma. Instead, a hydrogen plasma is generated in the remote plasma source 110, and the remote H plasma diffuses through the holes 112 in the showerhead 111 and into the processing chamber 102. The precursor(s) may be silicon-containing precursors. A silicon-containing precursor may have one or more silicon-hydrogen bonds and/or silicon-silicon bonds. A silicon-containing precursor may also have one or more silicon-oxygen bonds, silicon-nitrogen bonds, and/or silicon-carbon bonds. The precursor(s) and the hydrogen plasma are flowed into/exposed to the processing chamber 102 concurrently to form the silicon-containing film. In these deposition processes, the pressure in the reaction chamber may be maintained between about 0.2-40 Torr (in some cases between about 0.2-8 Torr, or between about 10-20 Torr), and the substrate temperature may be maintained between about 50-500° C. (in some cases between about 200-400° C.).

Any type of plasma source may be used in remote plasma source to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source can be the GAMMA®, manufactured by Novellus Systems of San Jose, Calif. Another example of such a RF remote plasma source can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source, such as the Astex®, also manufactured by MKS Instruments. A microwave plasma can be configured to operate at a frequency of 2.45 GHz. These plasma sources may also be used to form and/or recondition the low recombination material as described above.

Apparatus

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool. One example apparatus has been provided in FIGS. 1 and 2. However, the embodiments are not limited to this apparatus. The disclosed techniques are expected to be useful in any context where radical-based processing occurs. In many (but not necessarily all) cases, a remote plasma will be involved. In certain implementations, the embodiments may be practiced in a Versa-S apparatus available from Lam Research Corporation of Fremont, Calif.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In the context of the disclosed embodiments, the controller may be designed or configured to form and recondition the low recombination material coating, in addition to being designed or configured to process substrates according to whatever process the substrates are exposed to. The controller may have instructions to perform any of the processes/methods described herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Experimental results have shown that the disclosed low recombination material coating can be used to minimize the degree of radical recombination and maximize the amount of radicals available for processing on the substrate. Experimental results have also shown that the disclosed reconditioning process can be used to effectively convert built up material on chamber surfaces to a material that promotes a lower degree of radical recombination.

Figure 4A:
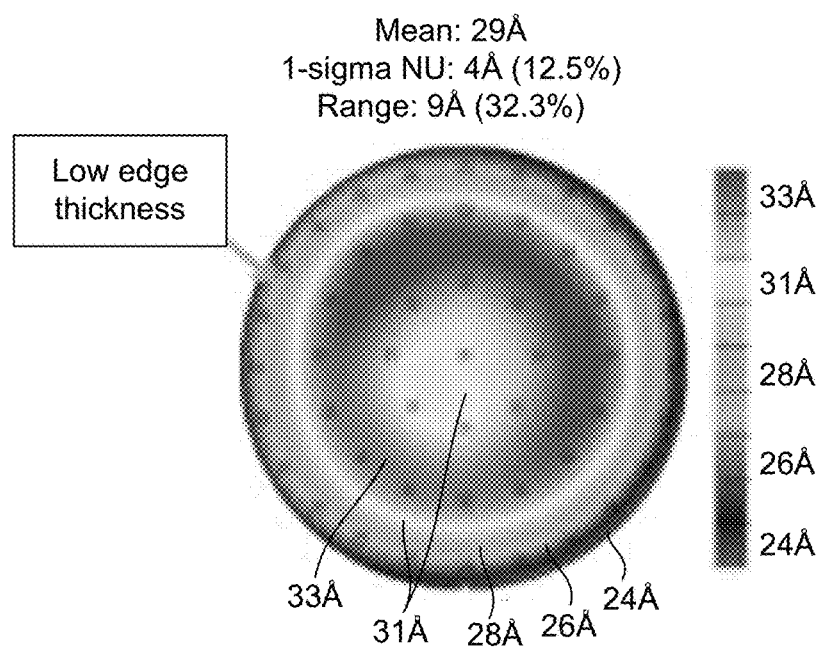
FIGS. 4A and 4B show film thickness profiles for substrates processed in a reaction chamber either before a low recombination material coating was reconditioned (FIG. 4A) or after a low combination material coating was reconditioned (FIG. 4B).
Figure 4B:
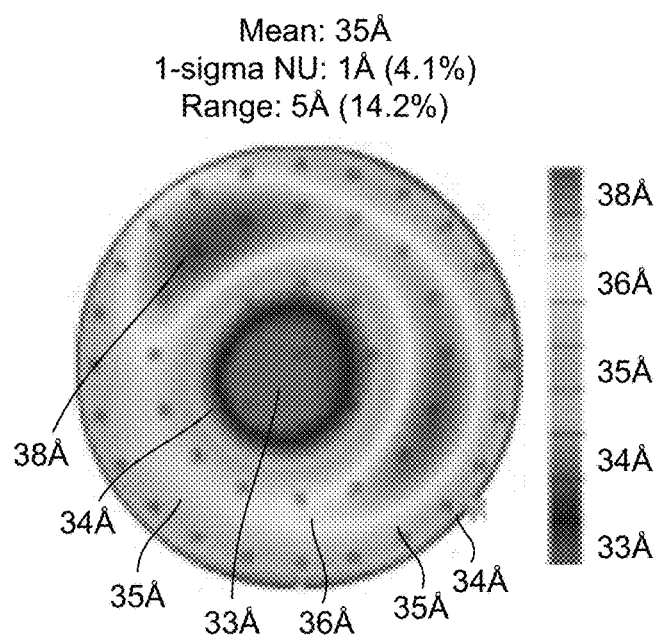

FIGS. 4A and 4B illustrate the thickness profiles of silicon-containing films deposited on substrates processed in a chamber that was initially coated with ALD-deposited $SiO_2$, and which has had some degree of material build up on chamber surfaces after the initial formation of the $SiO_2$ coating. FIG. 4A shows the thickness profile of a silicon-containing film deposited before the processing chamber was reconditioned with an oxygen plasma, and FIG. 4B shows the thickness profile of a silicon-containing film that was deposited after the processing chamber was reconditioned with an oxygen plasma. The profile in FIG. 4A shows significant center-to-edge thickness non-uniformity. The range of thicknesses observed in this case was about 9 Å between the thinnest and thickest portion of the film, which represented about 32% of the average film thickness. The 1-sigma thickness non-uniformity was calculated to be about 12.5%. By comparison, the substrate of FIG. 4B shows a much more uniform thickness profile, with a range of only about 5 Å, or about 14% of the average film thickness. The 1-sigma thickness non-uniformity in this case was only about 4.1%, which is much lower than the non-uniformity in FIG. 4A for the substrate processed before the chamber was reconditioned.

The profile in FIG. 4A shows that the deposited film is thin around the edges of the substrate. This edge-thin profile is expected due to the radicals effectively being drained away in this region because of the material build up on chamber surfaces proximate the edge of the substrate. By contrast, the profile in FIG. 4B is thickest at a mid-radius position, and is more uniform overall. These results suggest that the reconditioning process is very effective.

What is claimed is:

1. A method of conditioning a reaction chamber used to perform remote plasma processing, the method comprising:
   forming a low recombination material coating on exposed surfaces within the reaction chamber through an atomic layer deposition process while no substrate is present in the reaction chamber; and
   after performing a remote plasma operation on one or more substrates, exposing the reaction chamber to an oxidizing plasma to recondition the exposed surfaces within the reaction chamber and thereby reform the low recombination material coating.

2. The method of claim 1, further comprising after forming the low recombination material coating, performing the remote plasma operation to process one or more substrates in the reaction chamber, wherein the remote plasma operation results in formation of a second coating on at least a portion of the exposed surfaces within the reaction chamber, the second coating promoting a higher rate of radical recombination during the remote plasma operation than the low recombination material coating.

3. The method of claim 2, wherein exposing the reaction chamber to the oxidizing plasma modifies the second coating to reform the low recombination material coating.

4. The method of claim 3, wherein the low recombination material coating comprises silicon oxide, wherein performing the remote plasma operation comprises depositing a silicon-containing film on the one or more substrates, and wherein the second coating comprises a silicon-containing material.

5. The method of claim 3, wherein one or more substrates are present in the reaction chamber when the reaction chamber is exposed to the oxidizing plasma.

6. The method of claim 5, further comprising:
   after exposing the reaction chamber to the oxidizing plasma while the substrate is in the reaction chamber, performing a second remote plasma operation to further process the substrate in the reaction chamber, the second remote plasma operation again resulting in formation of the second coating; and
   after performing the second remote plasma operation, exposing the reaction chamber to a second oxidizing plasma while the substrate is present in the reaction chamber to again recondition the exposed surfaces within the reaction chamber to modify the second coating to reform the low recombination material coating.

7. The method of claim 2, wherein performing the remote plasma operation comprises:
   providing one of the one or more substrates in the reaction chamber,
   flowing a silicon-containing reactant into the reaction chamber without exposing the silicon-containing reactant to an in situ plasma,
   generating a hydrogen plasma in a remote plasma chamber, the remote plasma chamber being positioned proximate the reaction chamber and separated from the reaction chamber by a showerhead, and allowing the hydrogen plasma to pass through the showerhead into the reaction chamber while the silicon-containing reactant is flowed into the reaction chamber;
   exposing the substrate to the silicon-containing reactant and the hydrogen plasma concurrently to deposit a silicon-containing film on the substrate.

8. The method of claim 3, further comprising:
   cleaning the reaction chamber to remove any low recombination material coating and second coating present on the exposed surfaces within the reaction chamber, the cleaning comprising exposing the reaction chamber to a fluorine-containing plasma; and
   after cleaning the reaction chamber, repeating the method of claim 1.

9. The method of claim 1, wherein the reaction chamber is exposed to the oxidizing plasma for a duration between about 0.05-5 seconds.

10. The method of claim 9, wherein the duration is between about 0.1-1 seconds.

11. The method of claim 1, wherein the atomic layer deposition process for forming the low recombination material coating on exposed surfaces within the reaction chamber comprises:
   (a) flowing a first reactant into the reaction chamber and allowing the first reactant to adsorb onto exposed surfaces within the reaction chamber;
   (b) purging the first reactant from the reaction chamber;
   (c) flowing a second reactant into the reaction chamber;
   (d) exposing the exposed surfaces within the reaction chamber to plasma to drive a surface reaction between the first reactant and the second reactant to form a low recombination material coating on the exposed surfaces within the reaction chamber; and
   (e) repeating (a)-(d) until the low recombination material coating reaches a final coating thickness.

12. The method of claim 11, wherein the low recombination material coating comprises silicon oxide.

13. The method of claim 11, wherein at least one of the first and second reactants flows into the reaction chamber from a remote plasma chamber, the remote plasma chamber being located proximate the reaction chamber and separated from the reaction chamber by a showerhead.

14. The method of claim 13, wherein both the first and second reactants flow into the reaction chamber from the remote plasma chamber, and wherein the oxidizing plasma is generated in the remote plasma chamber and flows into the reaction chamber through the showerhead.

15. The method of claim 1, wherein the oxidizing plasma is generated in situ in the reaction chamber.

16. The method of claim 1, further comprising cyclically repeating the steps of (a) performing a remote plasma operation on one or more substrates and (b) exposing the reaction chamber to the oxidizing plasma to recondition the exposed surfaces within the reaction chamber, wherein between about 1-50 substrates are processed in (a) between each iteration of step (b).

17. The method of claim 1, further comprising performing the remote plasma operation on one or more substrates, the remote plasma operation comprising:

providing one of the one or more substrates in the reaction chamber, flowing a silicon-containing reactant into the reaction chamber without exposing the silicon-containing reactant to an in situ plasma, generating a hydrogen plasma in a remote plasma chamber, the remote plasma chamber being positioned proximate the reaction chamber and separated from the reaction chamber by a showerhead, and allowing the hydrogen plasma to pass through the showerhead into the reaction chamber while the silicon-containing reactant is flowed into the reaction chamber;

exposing the substrate to the silicon-containing reactant and the hydrogen plasma concurrently to deposit a silicon-containing film on the substrate.

18. The method of claim 1, wherein the low recombination material coating is formed at a thickness between about 50-500 Å, as measured by an average thickness of the low recombination material coating on a substrate support within the reaction chamber.

19. The method of claim 1, wherein the low recombination material coating comprises silicon oxide, the method further comprising performing the remote plasma operation on the one or more substrates by exposing the one or more substrates to a remote plasma to thereby deposit silicon carbide, silicon nitrocarbide, or silicon oxycarbide on the one or more substrates, wherein performing the remote plasma operation forms silicon carbide, silicon nitrocarbide, or silicon oxycarbide on the exposed surfaces within the reaction chamber, and wherein exposing the reaction chamber to the oxidizing plasma reforms the low recombination material coating by oxidizing the silicon carbide, silicon nitrocarbide, or silicon oxycarbide on the exposed surfaces within the reaction chamber, thereby reforming silicon oxide on the exposed surfaces within the reaction chamber.

* * * * *